(12) United States Patent
Mastboom et al.

(10) Patent No.: US 6,506,630 B2
(45) Date of Patent: Jan. 14, 2003

(54) METHOD OF MANUFACTURING A SEMICONDUCTOR DEVICE AND A SUPPORT PLATE WITH A FLANGE FOR A SEMICONDUCTOR DEVICE

(75) Inventors: Johannes Gerardus Petrus Mastboom, Tilburg (NL); Karianne Hilde Lindenhovius, Eindhoven (NL); Adrianus Johannes Maria Vugts, Eindhoven (NL)

(73) Assignee: Koninklijke Phillips Electronics N.V., Eindhoven (NL)

( * ) Notice: Subject to any disclaimer, the term of this patent is extended or adjusted under 35 U.S.C. 154(b) by 0 days.

(21) Appl. No.: 09/929,115

(22) Filed: Aug. 14, 2001

(65) Prior Publication Data

US 2002/0048853 A1 Apr. 25, 2002

(30) Foreign Application Priority Data

Aug. 18, 2000 (EP) .......................... 00202913

(51) Int. Cl.$^7$ ............................... H01L 21/44
(52) U.S. Cl. ..................... 438/124; 438/127
(58) Field of Search ................ 438/106, 111, 438/112, 123, 124, 127, 126; 257/710, 731, 732, 787, 666, 676; 29/835, 841, 844

(56) References Cited

U.S. PATENT DOCUMENTS 5,278,446 A * 1/1994 Nagaraj et al. ............ 257/707
5,367,191 A * 11/1994 Ebihara ..................... 257/666
6,294,409 B1 * 9/2001 Hou et al. .................. 438/123

FOREIGN PATENT DOCUMENTS

WO        WO9515578        6/1995        ........... H01L/23/31

* cited by examiner

Primary Examiner—Michael Sherry
Assistant Examiner—Scott B. Geyer
(74) Attorney, Agent, or Firm—Steven R. Biren

(57) ABSTRACT

A method of manufacturing a semiconductor device in which a semiconductor element, such as a diode, is attached to a support plate and provided with a plastic encapsulation. The plate is provided with a flange which is provided with an undercut region in order to improve the connection between the plate and the encapsulation. The plate is made from a ductile material. A step is formed in the surface of the plate by pressing using a first die, and by pressing using a second die, the flange provided with the undercut region is formed at, or near, the wall of the step. The flange should be formed at, or very close to, the wall of the step in the plate.

10 Claims, 2 Drawing Sheets

METHOD OF MANUFACTURING A SEMICONDUCTOR DEVICE AND A SUPPORT PLATE WITH A FLANGE FOR A SEMICONDUCTOR DEVICE

BACKGROUND OF THE INVENTION

The invention relates to a method of manufacturing a semiconductor device, wherein a semiconductor element is secured to a support plate and provided with a synthetic resin encapsulation, and wherein the support plate is provided with a flange with an undercut region to which the synthetic resin encapsulation is secured. The invention also relates to a semiconductor device obtained by means of said method, and to the manufacture of a support plate which can suitably be used in such a semiconductor device.

A method of the type mentioned in the opening paragraph is known from PCT patent specification WO 95/15578, published on Jun. 8, 1995. In said document it is described how a semiconductor element, in particular a semiconductor diode, is secured to a support plate and provided with a synthetic resin encapsulation. The support plate (see FIG. 6) is provided, by means of turning, with a projecting flange which plays a part in securing the synthetic resin encapsulation. The projection is provided with an undercut region by bending it by means of a die.

A drawback of the known method resides in that it is comparatively laborious and hence expensive.

SUMMARY OF THE INVENTION

Therefore, it is an object of the invention to provide a method enabling a semiconductor device to be manufactured in a simple and inexpensive manner, with the encapsulation of said semiconductor device being properly secured to the support plate.

For this purpose, a method of the type mentioned in the opening paragraph is characterized in accordance with the invention in that the support plate is made from a ductile material, a step is pressed in the surface of the support plate by means of a first die, and the flange provided with the undercut region is formed near the wall of the step by means of pressing using a second die. By manufacturing the support plate from a ductile material, it becomes possible to employ exclusively a die-technique to manufacture the entire flange. As a result, a method in accordance with the invention is simple and inexpensive. Providing the method is carried out correctly, a flange manufactured by means of said method and provided with an undercut region bonds satisfactorily to the synthetic resin envelope of the semiconductor element. To achieve this, it is necessary in accordance with the invention that the surface of the support plate is provided with a step by means of a first die. Near said step, a suitable flange provided with an undercut region can subsequently be formed in different ways. All this will be explained in greater detail when the different modifications are discussed hereinbelow.

In a preferred embodiment of a method in accordance with the invention, the support plate is locally recessed by means of the first die, resulting in a recessed portion forming the step in the surface of the support plate, after which a part of the wall of the recessed portion is pressed inwards by means of a second die having a larger width than the first die, resulting in the formation of the flange provided with the undercut region. This modification has important advantages. It only involves two dies and two die steps. A suitable edge provided with the undercut region is formed in a simple manner on either side of, or around, the first and the second die, which has a favorable effect on the adhesion of the encapsulation. In this modification, the semiconductor element can be provided and secured in the recessed portion, which has the additional advantage that the upper surface of the semiconductor element and the support plate can be co-planar. Inter alia the provision of a wire connection between the element and the support plate is simplified thereby.

In a favorable modification, the second die is a hollow die which is formed around the first die. By virtue thereof, the stamping process is simplified, and the second die is automatically accurately aligned with respect to the recessed portion. Preferably, the first die is concave in cross-section, and the cross-section of the second die is (slightly) faceted. By virtue thereof, on the one hand, the side wall of the recessed portion becomes more suitable for the formation of a flange with an undercut region and, on the other hand, such a flange can be formed more easily so as to have a geometry and dimensions which are suitable for a satisfactory adhesion of the synthetic resin encapsulation.

In a further, also favorable embodiment of a method in accordance with the invention, the first die is provided, near an outside, with a recess, and during pressing by means of the first die, a clamping ring is pressed on the surface of the support plate at the outside of the first die, as a result of which the step and a nearby projection are formed next to each other in the surface of the support plate, after which the projection is pressed towards the surface of the support plate by means of the second die which is provided with a facet for this purpose, resulting in the formation of the flange provided with the undercut region. In the space between the projection and the step, a groove is formed, as it were, which contributes to a satisfactory, i.e. strong, adhesion of the synthetic resin encapsulation to the support plate. Also this modification enables a plurality of flanges provided with undercut regions to be simultaneously formed.

Aluminum is a suitable ductile material. This material is light, readily machinable and solderable. Preferably, the flange is formed so as to be a continuous ring-shaped flange which is provided on the inside with the undercut region, and within which the semiconductor element is secured onto the support plate. This results in an optimum bond and simple, for example, circularly symmetrical tools. The semiconductor element can then be provided on the support plate, within the flange provided with the undercut region, after which the semiconductor element is provided with the synthetic resin encapsulation.

The semiconductor device obtained by means of a method in accordance with the invention is not only comparatively inexpensive but also very reliable. The invention also includes a method of manufacturing a support plate which can suitably be used in such a semiconductor device, said support plate being provided with a flange having an undercut region, characterized in that the support plate is made from a ductile material by pressing a step in the surface of the support plate by means of a first die, and the flange provided with the undercut region is formed near the wall of the step by means of pressing using a second die.

These and other aspects of the invention will be apparent from and elucidated with reference to the embodiment(s) described hereinafter.

Figure 1:
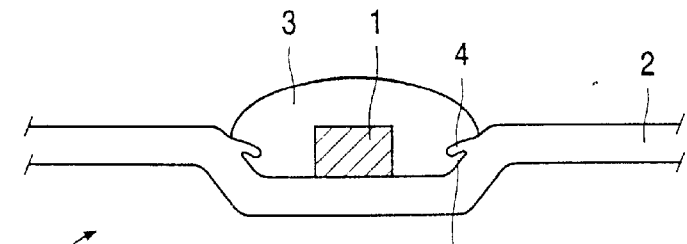
FIG. 1 is a diagrammatic, cross-sectional view, at right angles to the thickness direction, of a semiconductor device manufactured by means of a first embodiment of a method in accordance with the invention.

The Figures are diagrammatic and not drawn to scale; particularly the dimensions in the thickness direction are exaggerated strongly for clarity. Corresponding areas bear the same hatching and/or reference numeral whenever possible.

Figure 2:
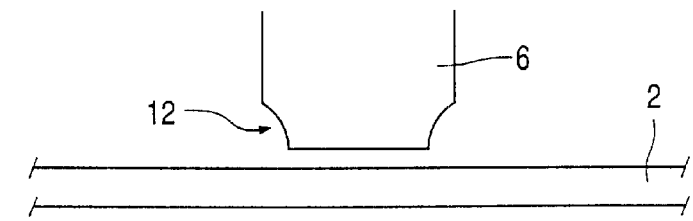
FIGS. 2 through 4 are diagrammatic, cross-sectional views, at right angles to the thickness direction, of the semiconductor device according to FIG. 1 in successive stages of the manufacturing process.
Figure 3:
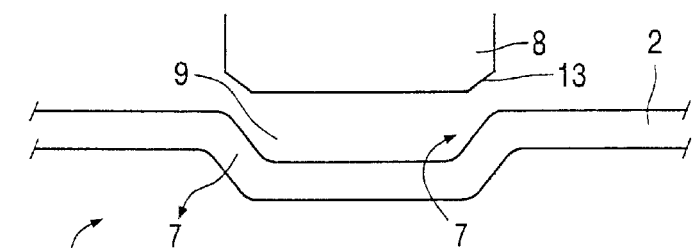
Figure 4:
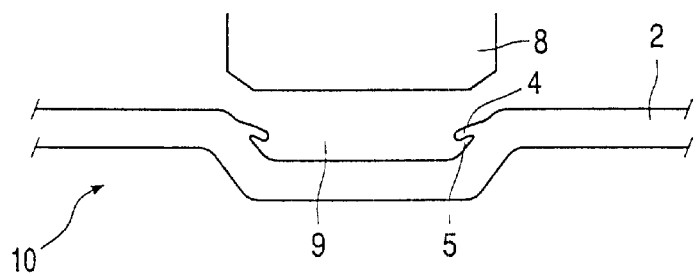

FIG. 1 is a diagrammatic, cross-sectional view, at right angles to the thickness direction, of a semiconductor device manufactured by means of a first embodiment of a method in accordance with the invention. FIGS. 2 through 4 show, in a corresponding manner, the device of FIG. 1 in successive stages of the manufacturing process. The device 10 comprises a support plate 2 on which a semiconductor element, in this case a semiconductor diode 1, is provided, which is surrounded by a synthetic resin encapsulation 3 which is made, in this case, of an epoxy synthetic resin. To obtain a good and stable adhesion of the synthetic resin encapsulation 3 and hence the diode 1 to the support plate, the plate 2 is provided with a flange 4 provided with an undercut region 5. The lower side of the diode 1 is secured, for example by means of a Sn solder, to the plate 2, which also forms one of the connection conductors of the diode 1. Another connection conductor of the diode 1, which is not shown in the drawing, is formed by a wire connection extending from the upper side of the diode 1 to a separate part of the plate 2. Therefore, the plate 2 is made of an electroconductive material.

In accordance with the invention, the support plate 2 is made from a ductile material, in this example aluminum, as a result of which the support plate can be manufactured entirely by means of stamping using a die. As a result, the device 10 can be readily manufactured and is inexpensive. In addition, a very good, stable adhesion of the synthetic resin encapsulation 3 to the plate 2 can be obtained. In a first step of the manufacturing process (see FIG. 2), a first die 6 is used to form a step 7, in this case two steps 7 adjoining a formed recessed portion 9, in the surface of the support plate 2. Subsequently, (see FIG. 3), by means of pressing using a second die 8, the flange 4 provided with the undercut region (5) is formed near, in this case in, the wall of the step 7. For this purpose, the width of the second die 8 is slightly larger than that of the first die 6, so that the shoulder of the wall of the plate 2 is pressed both downward and inward in the step, causing it to bend thereby forming (see FIG. 4) the flange 4 provided with the undercut region 5. To optimize the result, the outside of the first die 6 is provided on the lower side with convex recesses 12 having, for example, a width of 1 mm and a height of (approximately) 5 mm, and the lower side of the second die 8 is provided, on the outside, with facets 13 including a small angle, for example of 15 degrees, with the surface of the plate 2. An additional advantage of this method is that the thickness of the recessed portion 9 can be chosen to be approximately equal to the thickness of the diode 1, as a result of which the upper surface of the diode can lie in the same plane as the plate 2. As a result, it can be more readily connected by means of a wire connection. After the provision of such a connection, the synthetic resin encapsulation 3 is provided, for example by means of injection molding, around the diode 1. The device 10 is ready for use now. In this example, the device 10 has the following dimensions. The recessed portion 9 has a diameter of approximately 10 mm and a depth of approximately 3 mm. The thickness of the plate 2 is 3 mm. The diameters of the first and the second die 6, 8 are 10 and 12 mm, respectively, and the heights are 27 and 30 mm, respectively.

In a favorable modification, not shown, the second die 8 is formed so as to be hollow and is placed around the first die 6. As a result, the dies 6, 8 are automatically accurately aligned with respect to each other, resulting in a simplification and acceleration of the manufacture of the device 10.

Figure 5:
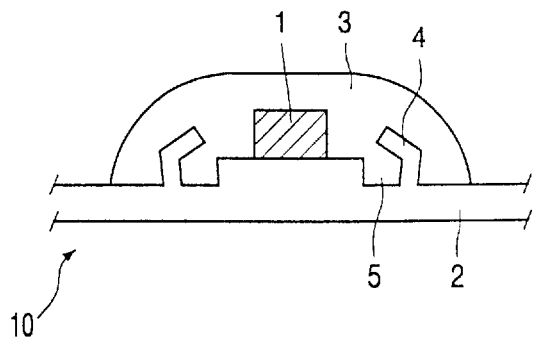
FIG. 5 is a diagrammatic, cross-sectional view, at right angles to the thickness direction, of a semiconductor device manufactured by means of a second embodiment of a method in accordance with the invention.
Figure 6:
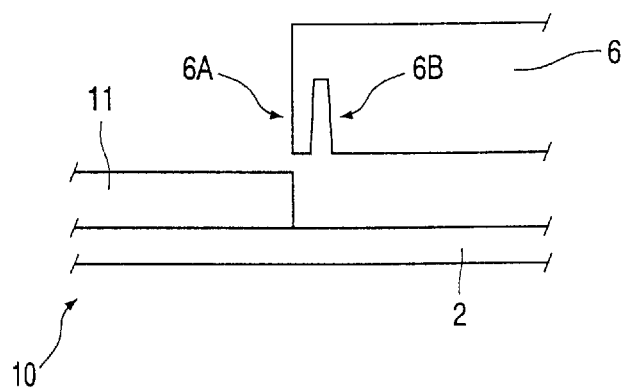
FIGS. 6 through 9 are diagrammatic, cross-sectional views, at right angles to the thickness direction, of the semiconductor device in accordance with FIG. 5 in successive stages of the manufacturing process.
Figure 7:
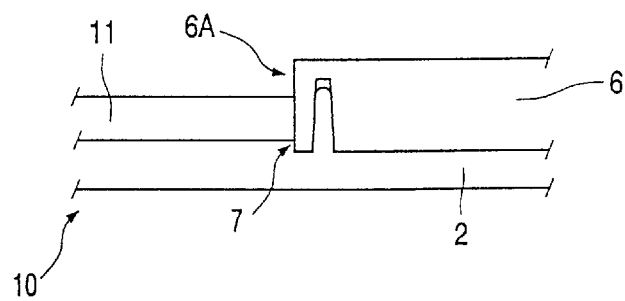
Figure 8:
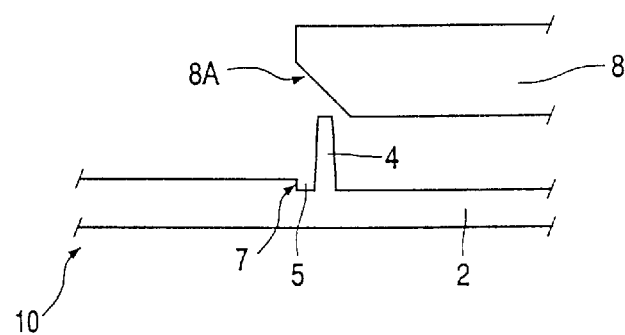
Figure 9:
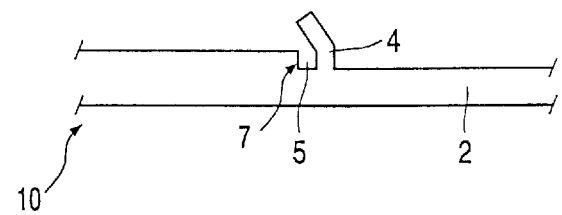

FIG. 5 is a diagrammatic, cross-sectional view, at right angles to the thickness direction, of a semiconductor device manufactured by means of a second embodiment of a method in accordance with the invention. FIGS. 6 through 9 show, in a corresponding manner, the device of FIG. 5 in successive stages of the manufacturing process. In this example, the device 10 of FIG. 5 comprises the same elements as the device 10 of the first example. Therefore, for the discussion of these elements reference will be made to the first example. An important difference between the two examples is that, in this example, the support plate 2 is neither warped nor recessed.

A description will now be given of the method of manufacturing in accordance with the invention. The first die 6 (see FIG. 6) is provided, near an outside 6A, with a recess 6B. During pressing by means of the first die, a clamping ring 11 is pressed onto the surface of the support plate 2 at the outside 6A of the first die 6. As a result, the step 7 and a flange 4 are formed next to each other in the surface of the support plate 2. Subsequently, the flange 4 is pressed towards the surface of the support plate 2 by means of the second die 8 which, for this purpose, is provided with a facet 8A, resulting in the formation of the flange 4 provided with the undercut region 5. The undercut region 5 situated next to the step 7, which undercut region is obtained by means of this method, is also found to contribute to a particularly good adhesion of the encapsulation 3 to the plate 2. After the provision of the diode 1 and the encapsulation 3, the device 10 is ready for use. In this example, the dimensions of the device 10 are comparable to those of the device 10 of the first example. The recess 6B has a width, in this example, of 0.25 mm, a height of 1.5 mm, and is situated at a distance of 4.8 mm from the step 7, which has a height of 0.5 mm.

Also in this example, the flange 4 is embodied so as to be a round or rectangular closed ring within which a diode 1 is soldered (or glued) onto the plate. In addition, the undercut region 5 is situated, in both examples, on the inside of the flange 4. However, this is not necessary. For example, in the first example a wide ring-shaped recessed portion 9 may alternatively be provided around the diode 1. By providing the encapsulation 3 so as to extend as far as the middle in the recessed portion 9, the adhesion takes place only by means of the flange 4, facing away from the diode 1, which flange is formed on the inside of the ring-shaped recessed portion 9. Also in the second example, the flange 4 can be readily directed outwards, i.e. facing away from the diode 1, the step 7 then being positioned on the outside of the flange 4.

The invention is not limited to the examples described herein, and within the scope of the invention many modifications and variations are possible to those skilled in the art. For example, semiconductor elements other than diodes can be employed, such as transistors or even integrated circuits. The support plate can be embodied so as to be a so-called lead frame, and it can also be made from (ductile) materials other than aluminum, such as copper or nickel. Also the geometry and dimensions can be chosen so as to differ from those used in the examples. It is further to be noted that the recess formed in the first example can also be provided without indenting the lower side, in which case the lower side of the plate may be flat. A clamping ring can also be used in the first example during the first stamping operation.

What is claimed is:

1. A method of manufacturing a semiconductor device (10), wherein a semiconductor element (1) is secured to a support plate (2) and provided with a synthetic resin encapsulation (3), and wherein the support plate (2) is provided with a flange (4) with an undercut region (5) to which the synthetic resin encapsulation (3) is secured, characterized in that the support plate (2) is made from a ductile material, a step (7) is pressed in the surface of the support plate (2) by means of a first die (6), and the flange (4) provided with the undercut region (5) is formed near the wall of the step (7) by means of pressing using a second die (8).

2. A method as claimed in claim 1, characterized in that the support plate (2) is locally recessed by means of the first die (6), resulting in a recessed portion (9) forming the step (7) in the surface of the support plate (2), after which the wall of the recessed portion (9) is pressed inwards by means of the second die (8) having a larger width than the first die (6), resulting in the formation of the flange (4) provided with the undercut region (5).

3. A method as claimed in claim 2, characterized in that the second die (8) is a hollow die which is formed around the first die (6).

4. A method as claimed in claim 2, characterized in that the first die (6) is concave in cross-section, and the cross-section of the second die (8) is faceted.

5. A method as claimed in claim 1, characterized in that the first die (6) is provided, near an outside (6A), with a recess (6B), and during pressing by means of the first die (6), a clamping ring (11) is pressed on the surface of the support plate (2) at the outside (6A) of the first die (6), as a result of which the step (7) and a projection (4) are formed next to each other in the surface of the support plate (2), after which the projection (4) is pressed towards the surface of the support plate (2) by means of the second die (8) which is provided with a facet (8A) for this purpose, resulting in the formation of the flange (4) provided with the undercut region (5).

6. A method as claimed in claim 1, characterized in that aluminum is used as the material for the support plate (2).

7. A method as claimed in claim 1, characterized in that the flange (4) is formed so as to be a continuous ring-shaped flange (4), which is provided on the inside with the undercut region (5) and within which the semiconductor element (1) is secured onto the support plate (2).

8. A method as claimed in claim 1, characterized in that after the formation of the flange (4) provided with the undercut region (5), and after the provision of the semiconductor element (1) on the support plate (2), the semiconductor element is provided with the synthetic resin encapsulation (3).

9. A semiconductor device (10) manufactured by means of a method as claimed in claim 1.

10. A method of manufacturing a support plate (2) which can suitably be used in a semiconductor device (10) as claimed in claim 9, wherein the support plate (2) is provided with a flange (4) having an undercut region (5), characterized in that the support plate (2) is made from a ductile material, a step (7) is pressed in the surface of the support plate (2) by means of a first die (6), and the flange (4) provided with the undercut region (5) is formed near the wall of the step (7) by means of pressing using a second die (8).

* * * * *

UNITED STATES PATENT AND TRADEMARK OFFICE
CERTIFICATE OF CORRECTION

PATENT NO. : 6,506,630 B2
DATED : January 14, 2003
INVENTOR(S) : Johannes Gerardus Petrus Mastboom, Karianne Hilde Lindenhovius and Adrianus Johannes Maria Vugts It is certified that error appears in the above-identified patent and that said Letters Patent is hereby corrected as shown below:

Title page,
Item [73], Assignee, change "Phillips" to -- Philips --.

Signed and Sealed this

Twenty-fifth Day of March, 2003

JAMES E. ROGAN
*Director of the United States Patent and Trademark Office*